United States Patent
Greaney et al.

(10) Patent No.: US 11,950,361 B2
(45) Date of Patent: Apr. 2, 2024

(54) METHOD AND PROCEDURE FOR MINIATURING A MULTI-LAYER PCB

(71) Applicant: Veea Inc., New York, NY (US)

(72) Inventors: Shaun Joseph Greaney, Freehold, NJ (US); Robert Migliorino, Wayne, NJ (US); Michael Liccone, Scotch Plains, NJ (US); Clint Smith, Warwick, NY (US)

(73) Assignee: VEEA INC., New York, NY (US)

( * ) Notice: Subject to any disclaimer, the term of this patent is extended or adjusted under 35 U.S.C. 154(b) by 0 days.

(21) Appl. No.: 17/946,450

(22) Filed: Sep. 16, 2022

(65) Prior Publication Data
US 2023/0017840 A1    Jan. 19, 2023

Related U.S. Application Data

(62) Division of application No. 17/313,073, filed on May 6, 2021, now Pat. No. 11,523,502.

(60) Provisional application No. 63/020,745, filed on May 6, 2020.

(51) Int. Cl.
*H05K 1/02* (2006.01)

(52) U.S. Cl.
CPC ......... *H05K 1/0298* (2013.01); *H05K 1/0218* (2013.01); *H05K 1/0231* (2013.01); *H05K 1/0242* (2013.01)

(58) Field of Classification Search
CPC .. H05K 1/0298; H05K 1/0218; H05K 1/0231; H05K 1/0242
See application file for complete search history.

(56) References Cited

U.S. PATENT DOCUMENTS

| | | | |
|---|---|---|---|
| 5,475,606 A | 12/1995 | Muyshondt et al. | |
| 5,964,854 A * | 10/1999 | Roozenbeek | H05K 1/181 361/600 |
| 6,844,505 B1 | 1/2005 | Fan et al. | |
| 7,692,101 B2 | 4/2010 | Duong | |
| 7,728,428 B2 * | 6/2010 | Lim | H05K 1/0231 257/774 |
| 8,716,898 B1 | 5/2014 | Liu et al. | |
| 9,036,364 B1 | 5/2015 | Fung | |
| 2005/0225955 A1 * | 10/2005 | Grebenkemper | H05K 1/0218 361/780 |
| 2007/0030626 A1 | 2/2007 | Barnett | |
| 2009/0140400 A1 * | 6/2009 | Amey, Jr. | H05K 1/162 257/664 |
| 2009/0323300 A1 * | 12/2009 | Fujimoto | C09J 163/00 428/355 R |
| 2010/0101850 A1 * | 4/2010 | Chou | H05K 1/0268 29/829 |

(Continued)

OTHER PUBLICATIONS

U.S. Appl. No. 18/053,264, filed Nov. 7, 2022, 103 pages.
U.S. Appl. No. 17/313,073, filed May 6, 2021, 61 pages.

*Primary Examiner* — Hoa C Nguyen
(74) *Attorney, Agent, or Firm* — THE MARBURY LAW GROUP, LLC

(57) ABSTRACT

A multiple layer printed circuit board (PCB) in which the cores (or core layers) are removed and replaced with prepreg layers, which provide structure integrity for the PCB. Such a multi-layer PCB may include signal layers, ground plane layers, inner signal layers, and a single core substrate layer. Each of the layers may be separated from the other layers by at least one prepreg substrate layer.

6 Claims, 12 Drawing Sheets

(56) References Cited

U.S. PATENT DOCUMENTS

| | | |
|---|---|---|
| 2010/0230145 A1 | 9/2010 | Holcomb |
| 2014/0027165 A1 | 6/2014 | Morita et al. |
| 2014/0204546 A1 | 7/2014 | Baker |
| 2015/0136447 A1 | 5/2015 | Katou et al. |

* cited by examiner

8 Layer MultiLayer PCB

| # | | Layer |
|---|---|---|
| 102 | Metal (Signals/PowerTraces + Shapes) | 1 |
| 104 | Prepreg | |
| 106 | Metal (Signals/PowerTraces + Shapes + GND) | 2 |
| 108 | Core | |
| 110 | Metal (Signals/PowerTraces + Shapes) | 3 |
| 112 | Prepreg | |
| 114 | Metal (Signals/PowerTraces + Shapes + GND) | 4 |
| 116 | Core | |
| 118 | Metal (Signals/PowerTraces + Shapes) | 5 |
| 120 | Prepreg | |
| 122 | Metal (Signals/PowerTraces + Shapes + GND) | 6 |
| 124 | Core | |
| 126 | Metal (Signals/PowerTraces + Shapes) | 7 |
| 128 | Prepreg | |
| 130 | Metal (Signals/PowerTraces + Shapes + GND) | 8 |

FIG. 1

12 Layer MultiLayer PCB

200

| # | Ref | Layer | Group |
|---|---|---|---|
| | 202 | Metal (Signals/PowerTraces + Shapes) | 1 |
| | 204 | Prepreg | |
| | 206 | Metal (Signals/PowerTraces + Shapes + GND) | 2 |
| | 208 | Core | |
| | 210 | Metal (Signals/PowerTraces + Shapes) | 3 |
| | 212 | Prepreg | |
| | 214 | Metal (Signals/PowerTraces + Shapes + GND) | 4 |
| | 216 | Core | |
| | 218 | Metal (Signals/PowerTraces + Shapes) | 5 |
| | 220 | Prepreg | |
| | 222 | Metal (Signals/PowerTraces + Shapes + GND) | 6 |
| | 224 | Core | |
| | 226 | Metal (Signals/PowerTraces + Shapes) | 7 |
| | 228 | Prepreg | |
| | 230 | Metal (Signals/PowerTraces + Shapes + GND) | 8 |
| | 232 | Core | |
| | 234 | Metal (Signals/PowerTraces + Shapes) | 9 |
| | 236 | Prepreg | |
| | 238 | Metal (Signals/PowerTraces + Shapes + GND) | 10 |
| | 240 | Core | |
| | 242 | Metal (Signals/PowerTraces + Shapes) | 11 |
| | 244 | Prepreg | |
| | 246 | Metal (Signals/PowerTraces + Shapes + GND) | 12 |

FIG. 2

METHOD AND PROCEDURE FOR MINIATURING A MULTI-LAYER PCB

RELATED APPLICATIONS

This application is a Divisional of U.S. Non Provisional patent application Ser. No. 17/313,073, entitled "Method and Procedure for Miniaturing a Multi-Layer PCB" filed May 6, 2021, which claims the benefit of priority to U.S. Provisional Application No. 63/020,745, entitled "Method and Procedure for Miniaturing a Multilayer PCB" filed May 6, 2020, the entire contents of both of which are hereby incorporated by reference for all purposes.

BACKGROUND

Printed circuit boards (PCBs) are the core of most electronics today, and one of the most important components in an electrical system not shown on schematics. PCBs are electrical systems with electrical properties and have discrete components and devices mounted to them. Generally, PCBs are made up of an insulator substrate material that has metal plating on one or both sides, typically copper. The PCB may also have portions of metal (typically copper) that is etched away to form conductive paths or to assist in mounting devices.

A PCB may be a single or multiple layer board design. Multi-layer PCBs include plated and etched substrates that are glued together in a stack with additional insulator substrates between the etched substrates. Holes may be drilled through the multilayer stack, and conductive plating may be applied to the holes to form conductive connections between the different layers of the etched copper.

Multi-layer PCBs are more complex than single layer PCB boards, but have many added advantages such as performance improvements like noise, stray capacitance and cross talk. Multi-layer PCBs also enable miniaturization of electronics.

SUMMARY

The various aspects include a multi-layer printed circuit board (PCB) that includes a plurality of layers, including a plurality of signal layers, a plurality of ground plane layers, a plurality of inner signal layers, and a single core substrate layer, and in which each layer in the plurality of layers is separated from the other layers in the plurality of layers by at least one prepreg substrate layer. In some aspects, the prepreg substrates may provide the overall structural integrity of the multi-layer PCB. In some aspects, the first, second, third and fourth ground plane layers may be connected via one or more leads to provide a shared common ground for both analog and digital signals.

In some aspects, the multi-layer PCB may include a single decoupling capacitor per N finite element method (FEM) components. In some aspects, the multi-layer PCB may include one ferrite bead per N finite element method (FEM) components. In some aspects, the multi-layer PCB may include multi-layer PCB includes a single power distribution network (PDN).

The various aspects may also include a multi-layer PCB that includes a first signals layer, a first prepreg substrate abutting the first signals layer, a first ground plane layer abutting the first prepreg substrate, a second prepreg substrate abutting the first ground plane layer, a first inner signal layer abutting the second prepreg substrate, a third prepreg substrate abutting the first inner signal layer, a second inner signal layer abutting the third prepreg substrate, a fourth prepreg substrate abutting the second inner signal layer, a second ground plane layer abutting the fourth prepreg substrate, a fifth prepreg substrate abutting the second ground plane layer, a third inner signal layer abutting the fifth prepreg substrate, a core substrate abutting the third inner signal layer, a fourth inner signal layer abutting the core substrate, a sixth prepreg substrate abutting the fourth inner signal layer, a third ground plane layer abutting the sixth prepreg substrate, a seventh prepreg substrate abutting the third ground plane layer, a fifth inner signal layer abutting the seventh prepreg substrate, an eighth prepreg substrate abutting the fifth inner signal layer, a sixth inner signal layer abutting the eighth prepreg substrate, a ninth prepreg substrate abutting the sixth inner signal layer, a fourth ground plane layer abutting the ninth prepreg substrate, a tenth prepreg substrate abutting the fourth ground plane layer, and a second signals layer abutting the tenth prepreg substrate.

Further aspects may include a computing device (e.g., an edge computing device, etc.) that includes the multi-layer PCBs discussed above.

BRIEF DESCRIPTION OF THE DRAWINGS

The accompanying drawings, which are incorporated herein and constitute part of this specification, illustrate exemplary embodiments of the invention. Together with the general description given above and the detailed description given below, the drawings serve to explain features of the invention.

FIG. 1 is a component block diagram that illustrates an 8-layer printed circuit board configured in accordance with some embodiments.

FIG. 2 is a component block diagram that illustrates a 12-layer printed circuit board configured in accordance with some embodiments.

FIG. 4A illustrates a multi-layer printed circuit board that includes separate analog and digital grounds. FIG. 4B illustrates a multi-layer printed circuit board that includes a common ground.

DETAILED DESCRIPTION

Figure 3:
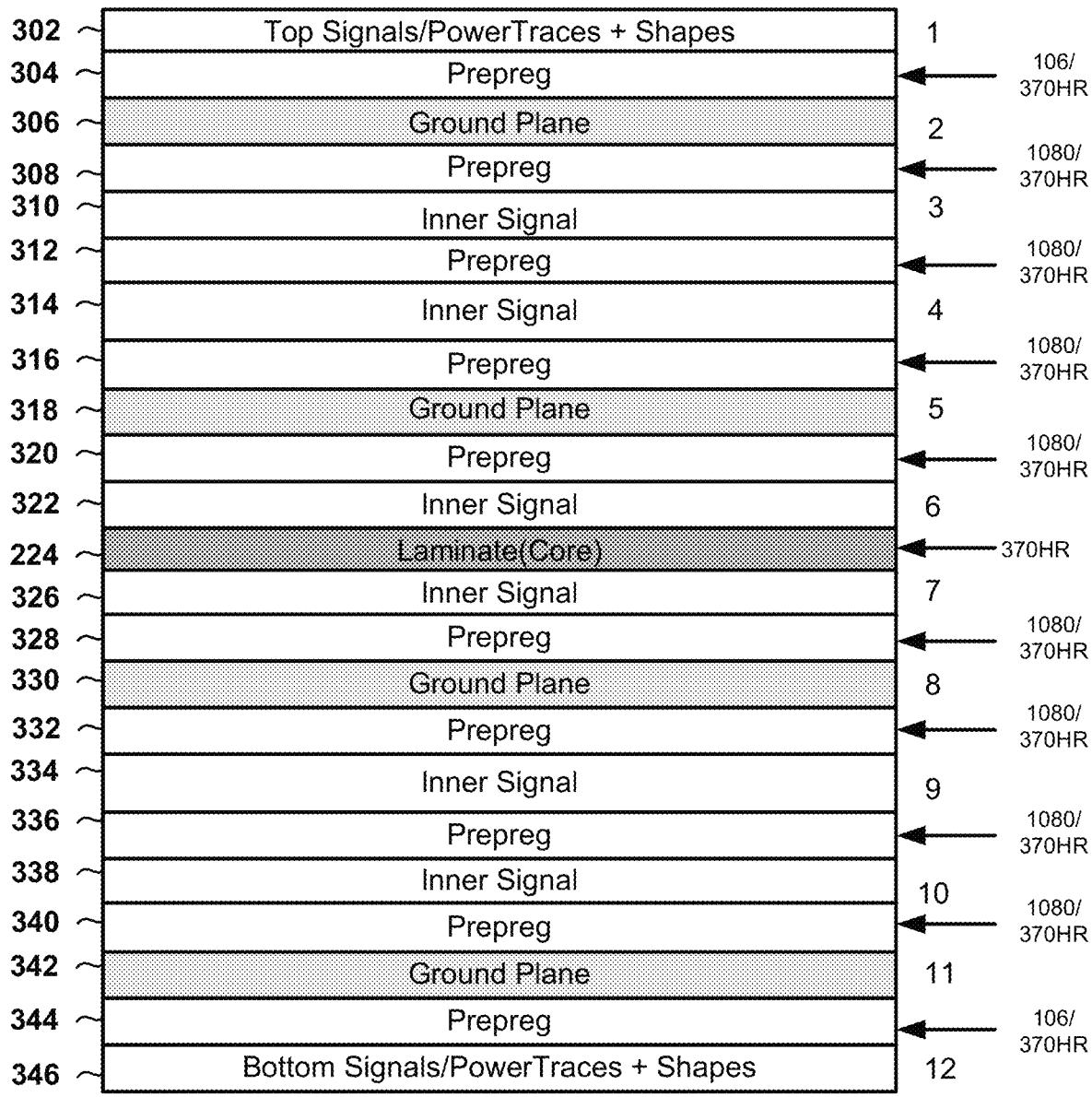
FIG. 3 is a component block diagram that illustrates a 12-layer printed circuit board having a single core that may be configured in accordance with some embodiments.

The various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

In overview, the various embodiments include a multiple layer printed circuit board (PCB) in which the cores (or core layers) are removed and replaced with prepreg layers that provide structure integrity for the PCB. For example, some embodiments include multi-layer PCB that includes a plurality of layers that include a plurality of signal layers, a plurality of ground plane layers, a plurality of inner signal layers, and a single core substrate layer. Each layer in the plurality of layers may be separated from every other layer in the plurality of layers by at least one prepreg substrate layer. This organization (e.g., replacement of core layers with prepreg substrate layers) may increase the densification of the multi-layer PCB, reduce the overall stack height of the multi-layer PCB, and/or improve its power efficiency (e.g., through better impedance matching). Increasing the densification of the multi-layer PCB improves the performance of the multi-layer PCB, and reducing the overall stack height reduces the thickness of the multi-layer PCB (i.e., by removing the need for having multiple core layers, etc.).

The embodiments also include a power distribution network (PDN) that includes a single power distribution system (instead of multiple). The PDN may include a reduced number of ferrite beads, which may improve power efficiency through reduced impedance loss. The PDN may also include a reduced number of decoupling caps, for better impendence matching and improved transient power delivery.

The embodiments also include a shared grounding system that includes common analog and digital grounds, which improves noise and power distribution, reduces decoupling caps with equivalent for better impendence matching, and separates grounds from signal traces to improve circuit/PCB density.

A number of different cellular and mobile communication services and standards are available or contemplated in the future, all of which may implement and benefit from the various embodiments. Such services and standards include, e.g., third generation partnership project (3GPP), long term evolution (LTE) systems, third generation wireless mobile communication technology (3G), fourth generation wireless mobile communication technology (4G), fifth generation wireless mobile communication technology, global system for mobile communications (GSM), universal mobile telecommunications system (UMTS), 3GSM, general packet radio service (GPRS), code division multiple access (CDMA) systems (e.g., cdmaOne, CDMA2000™), enhanced data rates for GSM evolution (EDGE), advanced mobile phone system (AMPS), digital AMPS (IS-136/TDMA), evolution-data optimized (EV-DO), digital enhanced cordless telecommunications (DECT), Worldwide Interoperability for Microwave Access (WiMAX), wireless local area network (WLAN), public switched telephone network (PSTN), Wi-Fi Protected Access I & II (WPA, WPA2), Bluetooth®, integrated digital enhanced network (iden), and land mobile radio (LMR). Each of these technologies involves, for example, the transmission and reception of voice, data, signaling and/or content messages. It should be understood that any references to terminology and/or technical details related to an individual telecommunication standard or technology are for illustrative purposes only and are not intended to limit the scope of the claims to a particular communication system or technology unless specifically recited in the claim language.

The terms "wireless network", "network", "cellular System", "cell tower" and "radio access point", "internet", "local network" may be used generically and interchangeably herein to refer to any one of various wired or wireless systems. In an embodiment, a wireless network may be a radio access point (e.g., a cell tower), which provides the radio link to the mobile device so that the mobile device can communicate with the core network.

The terms "mobile device," "user device," and "wireless device," may be used interchangeably herein to refer to any one or all of cellular telephones, smartphones, personal data assistants (PDA's), laptop computers, tablet computers, ultrabooks, palm-top computers, wireless electronic mail receivers, multimedia Internet enabled cellular telephones, wireless gaming controllers, IoT devices, and other electronic devices that include a programmable processor, a memory and circuitry for sending and/or receiving wireless communication signals. While the various embodiments are particularly useful in IoT devices, the embodiments are generally useful in any computing device that may be used to wirelessly communicate information.

The term "IoT device" may be used herein to refer to a wireless device that may use radio frequency (RF) communications to communicate with another device, for example, as a participant in a communication network, such as the IoT. Such communications may include communications with another IoT device, a base station (including a cellular communication network base station and an IoT base station), an access point (including an IoT access point), or mobile devices.

The terms "edge device," and "edge computing device" may be used interchangeably herein to refer to a computing device that is configured to perform or implement edge computing techniques or technologies. An edge device may include a programmable processor, various memories, and communications circuitry for establishing communication links to user devices (e.g., smartphones, UEs, IoT devices, etc.) and/or to network components in a service provider, core, cloud, or enterprise network. An edge device may include or implement functionality associated any one or all of an access point, gateway, modem, router, network switch, residential gateway, mobile convergence product, networking adapter, customer premise device, multiplexer and/or other similar devices.

The term "edge computing" may be used herein to refer to systems, techniques or technologies that improve the user experience by offloading computation-intensive tasks from user devices to edge devices or servers deployed at the edge of the networks, thereby freeing up resources on user devices and/or allowing the user device to perform more computations or more resource-intensive tasks. Edge computing may be regarded as a new paradigm for overcoming resource shortages on resource-constrained user computing devices.

The various embodiments include multi-layer printed circuit board (PCB) and a method of manufacturing the same. In particular, the various embodiments include high density PCBs and methods of manufacturing the same that enable the manufacture of a thin PCB. The embodiments may also overcome various technical challenges and problems that arise when using conventional methods of manufacturing PCBs.

As mentioned above, multi-layer PCBs are more complex than single layer PCB boards, but have many added advantages. Multi-layer PCB boards enable: (1) smaller size verse single layer for same function; (2) increased component density for increased functionality; and (3) improved performance for EMI shielding, impedance control and reduced weight. Some limitations of conventional multi-layer PCBs include: (1) they are not applicable for all applications; (2) there are higher costs compared to single- and double-layer PCBs; and (3) there is an increase in design and manufacturing complexity (i.e., increased cost, etc.).

For commercial reasons multi-layer PCBs, while offering many benefits, need to have the manufacturing costs reduced to facilitate increased miniaturization through circuit densification. The reduction in manufacturing costs with the increased complexity needs to be achieved at the same time increasing functionality and reducing the overall bill of materials used for creating the electrical system itself.

Multi-layer PCBs because of their physical geometry have both thermal (heat) and power challenges that may degrade the performance and overall usefulness. As the component density increases the need for more layers to be included in the multi-layer PCB continues to increase. However, with multi-layer PCBs, the manner in which power and thermal issues are handled is very important to the overall functionality and performance of the electrical system that resides on the PCB.

The embodiments provide a method for increasing the densification of the components in a multi-layer PCB while reducing the bill of materials and improving the functionality of the overall system.

Multi-layer PCBs are essential in the miniaturization of electronic system functionality. The miniaturization using multi-layer PCBs may be achieved through increased circuit densification resulting in a smaller geographic real estate that needs to be used. The miniaturization of the electronic system functionality increases functionality for the same geographic area either by having more components placed on a multi-layer PCB or having several multi-layer PCBs occupy the same real estate that was used by less layered PCBs.

Each PCB, whether it is a single of multi-layer PCB, has a fundamental structure. For example, each layer of the PCB may include a (1) silkscreen; (2) solder mask; (3) metal, usually copper; and (4) substrate.

The silkscreen is the layer that adds letters and numerical indicators that are meant to make functions readable. The silkscreen layer is usually white in color however other colors may be used.

The solder mask is also called the liquid photo image solder mask (LPISM) and is meant to prevent leakages of liquid solder from locations on the PCB it is not meant to go.

The metal, which is usually copper, may be laminated onto a substrate. The metal may then be etched, providing areas on the PCB that have metal and areas that do not. The metal etching may be used to provide signal routes, traces, thermal dissipation or connectivity for components on the PCB.

The substrate may be made up of a fiberglass weave that has resin impregnated in it. The substrate may provide a ridged foundation for the PCB. The substrate may either be a prepreg (PP) or core layer depending on the function. A conventional multi-layer PCB typically has several prepreg and core layers. As such, the multi-layer PCB may be a combination of several core and prepreg put together.

Generally, prepreg (PP) is "pre-impregnated" composite fibers where a thermoset polymer matrix material, such as epoxy, or a thermoplastic resin is already present. In the context of PCBs, prepreg is a sheet of insulating material used for the multi-layer PCB and is used as an insulting material for the PCB. Prepreg is a fiber weave impregnated with a resin bonding agent. The prepreg is used to stick the core layers together. Without the prepreg there would be nothing there to hold the layers together.

The prepreg (PP) is mainly used for bonding and insulating material each layer of the multi-layer PCB. The prepreg is also semi rigid. The core however is more rigid than the prepreg. A core may be one or more prepreg laminates that are pressed, hardened, and cured with heat, and plated with copper foil on each side. The core's function is to provide structural integrity to the PCB.

Some of the other items which make up a PCB include: (1) traces; (2) planes; (3) planlet; (4) via; (5) pads; (6) anti-pads; and (7) lands.

Traces may be a physical strip of metal (typically copper) that is used to make electrical connections between two or more points on the PCB itself. The trace may carry the electrical signals between the points on a PCB.

Planes may be an uninterrupted area of metal covering a PCB layer. A plane may distribute power or provide a ground for a number of points in a PCB.

The planlet may be an uninterrupted area of metal that covers part of the PCB layer. It is possible to have several planets covering a single layer in a PCB. The Planlet may distribute power or provide a ground for a number of points in a PCB.

A via may be a piece of metal that makes electrical connection between several layers of a PCB. Vias provide the electrical path for signals, power or ground between layers in a PCB. There are several types of Vias. Plated Through Hole (PTH) may include a hole (drilled or via a laser). With High density interconnect (HDI), the vias may only penetrate one or two layers. Stepped vias may be used to provide the connection path between multiple layers.

A pad may be small area in a PCB that has metal and is used to make electrical connections. Pads are used to connect the via to traces, planes or planlets.

An antipad may be a small area that is devoid of metal and are used in planes and are not meant to provide electrical connectivity.

A land may be a pad that is exposed on the outer layer of the PCB, and which may be used to connect SMD to the PCB. Electrical connections to the Lands are done by a vias and or traces.

With multi-layer PCBs an important design parameter is the layer thickness. The PCB layer thickness as well as the number of layers defines the total multi-layer PCB thickness. The PCB thickness and spacing between layers defines the signal trace impedance, cross talk and parasitic inductance.

FIG. 1 is an illustration of an 8-layer multi-layer PCB 100. In the example illustrated in FIG. 1, the multi-layer PCB 100 includes 8 layers (i.e., layers 1-8) of metal (e.g., copper, etc.) with multiple prepreg (PP) and cores. More specifically, the multi-layer PCB 100 illustrated in FIG. 1 includes metal layers 102, 106, 110, 114, 118, 122, 126 and 130, each of which may include signals, power traces, and/or shapes components (e.g., for controlling inductance, trace width, the shape and impedance of the signal or path, etc.). Metal layers 106, 114, 122 and 130 also include a ground (GND).

The multi-layer PCB 100 also includes a plurality of prepreg (PP) substrate layers 104, 112, 120, 128 and a plurality of core substrate layers 108, 116, 124. As mentioned above, prepreg (PP) substrate layer may include a sheet of insulating material that provides bonding and insulting for each layer of the multi-layer PCB.

FIG. 2 is an illustration of a 12-layer multi-layer PCB 200. In the example illustrated in FIG. 2, the multi-layer PCB 200 includes 12 layers (i.e., layers 1-12) of metal with multiple prepreg (PP) and cores in between. More specifically, the multi-layer PCB 200 illustrated in FIG. 2 includes metal layers 202, 206, 210, 214, 218, 222, 226, 230, 234, 238, 242 and 246, each of which may include signals, power traces, and/or shapes components. Metal layers 206, 214, 222, 230, 238 and 246 also include a ground (GND).

The multi-layer PCB 200 also includes a plurality of prepreg (PP) substrate layers 204, 212, 220, 228, 236, and 244. The multi-layer PCB 200 includes a plurality of core substrate layers 208, 216, 224, 232, 240.

The prepreg (PP) and cores shown in FIG. 1 and FIG. 2 are normally dispersed in the layers, stack layers. In the 8-layer multi-layer PCB shown in FIG. 1 the prepreg (PP) and core (C) relationship is PP-C-PP-C-PP-C-PP. While the prepreg and core relationship in FIG. 2 is PP-C-PP-C-PP-C-PP-C-PP-C-PP.

In a multi-layer PCB the standard design process is to have several cores along with prepregs (PPs). The relationship in FIG. 1 could be PP-PP-C-PP-C-PP-PP however standard design practices call for PP-C-PP-C-PP-C-PP. The number of cores used in a multi-layer PCB is meant for rigidity since the core is a fiberglass laminate.

To provide rigidity the core in a multi-layer PCB is typically significantly thicker than the prepreg (PP). The core thicknesses which are used for construction of 0.062" thick multilayers are 0.005", 0.008", 0.014", 0.021, 0.028", and 0.039".

Prepreg (PP) may be similar to a core, with the basic material with the two having completely different functions. A prepreg may be curled while the core is rigid and resists bending. The prepreg is not conductive, and the core typically has a metal layer on both sides which is the conductive medium of printed circuit board.

The prepreg (PP) may have a metal layer adhered to both of its sides like a core with the exception that it is not as rigid as a core would be. By placing metal on both sides of the prepreg additional rigidity is provided by the prepreg. By having several prepregs (PPs) with metal on both sides the collective strength of the several prepregs may replace the need for one or more cores in a multi-layer PCB.

To facilitate further miniaturization the thickness of the multi-layer PCB may be further reduced by removing the need for having multiple cores. The prepreg (PP) while having similar characteristics of the core may be used for multi-layer PCB structural integrity.

In addition, by sandwiching multiple prepregs (PPs) together a significant reduction in the multi-layer PCB thickness may be achieved resulting in a lower stack height. The prepreg (PP) height may be similar to that of the core height. The use of the prepregs (PPs) as part of the overall structural integrity of the multi-layer PCB board is a novel approach.

However, if the core is metallic and not fiberglass the rigidity of the multi-layer PCB is increased as well as the thermal dissipation a core height may be significantly reduced. For instance a core height is achievable of less than 0.003 inches and with the prep height reduction results in a significant reduction in overall stack height with a 12 layer PCB having a total height of 1 mm or less which is significantly less than that of a FR4.

FIG. 3 illustrates a 12-layer multi-layer PCB 300 that has a single core. In the example illustrated in FIG. 3, the multi-layer PCB 300 includes a first signals layer 302, and a first prepreg substrate 304 abutting, adjacent, a top, below, adjoining, bordering, conterminous, contiguous, flanking, flush with, fringing, joining, juxtaposed, neighboring, skirting, touching, verging, attaching, communicating with, connecting, interconnecting, joining, linking, or uniting (herein collectively abutting) the first signals layer 302. The multi-layer PCB 300 also includes a first ground plane layer 306 abutting the first prepreg substrate 304, a second prepreg substrate 308 abutting the first ground plane layer 306, a first inner signal layer 310 abutting the second prepreg substrate 308, a third prepreg substrate 312 abutting the first inner signal layer 310, a second inner signal layer 314 abutting the third prepreg substrate 312, a fourth prepreg substrate 316 abutting the second inner signal layer 314, a second ground plane layer 318 abutting the fourth prepreg substrate 316, a fifth prepreg substrate 320 abutting the second ground plane layer 318, a third inner signal layer 322 abutting the fifth prepreg substrate 320, a core substrate 324 abutting the third inner signal layer 322, a fourth inner signal layer 326 abutting the core substrate 324, a sixth prepreg substrate 328 abutting the fourth inner signal layer 326, a third ground plane layer 330 abutting the sixth prepreg substrate 328, a seventh prepreg substrate 332 abutting the third ground plane layer 330, a fifth inner signal layer 334 abutting the seventh prepreg substrate 332, an eighth prepreg substrate 336 abutting the fifth inner signal layer 334, a sixth inner signal layer 338 abutting the eighth prepreg substrate 336, a ninth prepreg substrate 340 abutting the sixth inner signal layer 338, a fourth ground plane layer 342 abutting the ninth prepreg substrate 340, a tenth prepreg substrate 344 abutting the fourth ground plane layer 342, and a second signals layer 346 abutting the tenth prepreg substrate 344.

The illustrated example, the first signals layer 302 is a top signals/power-traces and shapes layer. The second signals layer 346 is a bottom signals power-traces and shapes layer.

The single core 224 allows for the multi-layer PCB 300 to be further miniatured by reducing the number of cores, and thus reducing the overall multilayer stack height of the multi-layer PCB 300.

Additionally, in FIG. 3 the pegs or prepregs (PPs) may be used with a resin, which provides more structural and thermal dissipating capabilities allowing for smaller overall thickness of the combined multi-layer PCB.

The unique design of having a single core with the multi-layer PCB 300, in the layout PP-PP-PP-PP-PP-C-PP-PP-PP-PP-PP, is meant to not only reduce the stack height but also control impendence within the multi-layer PCB.

With multi-layer PCBs there are numerous signal traces and reference planes. The combination of a signal trace and a reference plane may form a transmission line. All input and output signals in a PCB system travel through transmission lines. With PCB and especially multi-layer PCBs good signal integrity is dependent on having transmission lines with controlled impedance.

As with all multi-layer PCBs increasing the metal (e.g., copper) thickness increases the cross-sectional area of the circuit traces and the amount of current they may reliability pass. Increasing the copper thickness is used to minimize real estate on the PCB surface since without increasing the copper thickness the traces would need to be wider resulting in less densification of the components capable with a multi-layer PCB.

Signals in a multi-layer PCB nay be currents (not voltages). As frequency increases, resistance becomes less and less important. Inductance begins to dominate the impedance which may negatively impact the performance of the multi-layer PCB through increased noise and return currents.

Noise is generated inside the device and is coupled out in many different possible ways in a multi-layer PCB. The noise may be present on all outputs, inputs, power supply, and ground at all times. With every pin on the microcomputer potentially being a noise source.

As such, a large problem in multi-layer PCBs is noise from the integrated-circuit (IC) that comes from the input/output (I/O) pins. This is because this area is covered by traces connected to them on the PCB and forming a large antenna. These pins also connect to both internal and external devices and connectors.

Another source of noise is the power-supply system, which includes the voltage regulation and the bypassing capacitors at both the regulator and at the microcomputer.

A third noise source is the oscillator circuit.

With signaling very edge transition that is sent from the microcomputer to another chip is a current pulse. Loops exist everywhere. Any noise voltage and its associated current travels the path(s) of lowest impedance back to the place where it was generated.

Noise in a multi-layer PCB appears as both differential and common mode noise.

Differential-mode noise is the noise of a signal as it travels down its trace to the receiving device, then back along the return path. There is a differential voltage between the two wires and is caused by every signal. There should be no differential between the signal and its return.

However common mode noise is the voltage difference that occurs because of impedance along the path the signal takes. Ground bounce is an example of common mode noise.

While the dielectric constant of the laminate varies from board to board, it is fairly constant within one board, layer. Therefore, the relative impedance of transmission lines in a PCB is defined most strongly by the trace geometries and tolerances. Impedance variance may occur based on the presence or absence of glass in a local portion of the laminate weave which becomes more critical with high speed interfaces that exceed 1 Gbps. Impedance in a multi-layer PCB changes based on the frequency that transverses the signal trace.

With a multi-layer PCB noise may be coupled by: (1) conducted: two currents in the same copper; (2) Near-field Magnetic (inductors and transformers); (3) Near-field Electric (capacitors); and (4) Far-field Electromagnetic (RF).

As with all signals DC return current follows the lowest resistance while AC (RF) return current follows the lowest impedance. Minimizing the impendence with a multi-layer PCB with reduced prepreg (PP) and core sizes helps in minimizing the layer to layer impedance at high frequencies due the distance between and layers is less than 10% of the highest frequency used thereby minimizing coupled noise effects.

The reduction in distance between the top and bottom layer in a multi-layer PCB enables the multi-layer PCB to be used in extremely high frequency allocations while facilitating miniaturization through component densification.

Figure 4A:
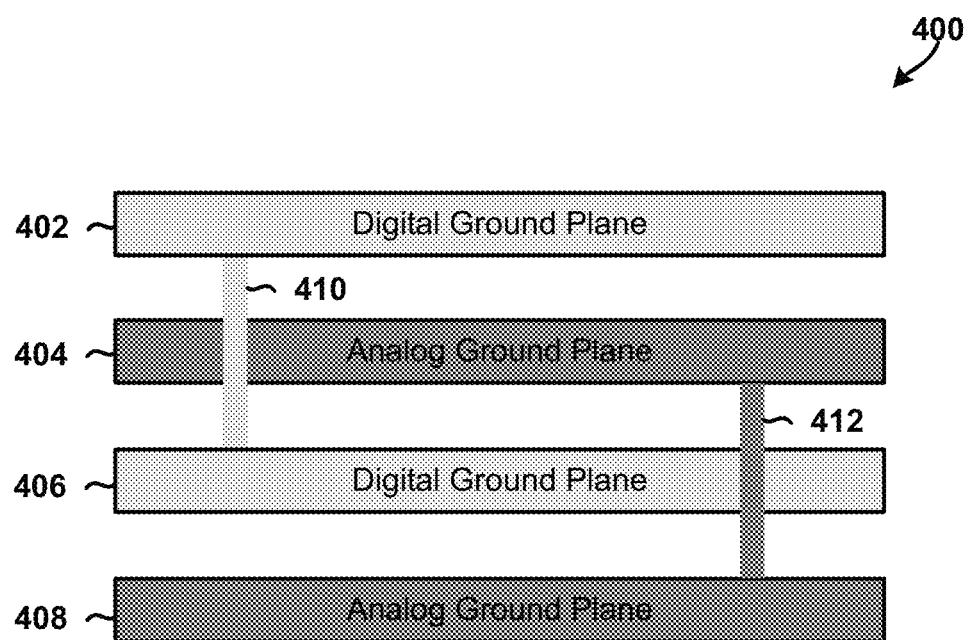
FIGS. 4A and 4B are component block diagrams that illustrate multi-layer printed circuit board grounds. In particular.

FIG. 4A illustrates a grounding system 400 that includes separate analog and digital grounds in accordance with some embodiments. The grounding system 400 includes digital ground planes 402, 406 and analog ground planes 404, 408. The digital ground planes 402, 406 are coupled together via a lead 410. The analog ground planes 404, 408 are coupled together via a lead 412.

A standard design practice in multi-layer PCBs is to separate the analog and digital ground planes to improve the performance as shown in FIG. 4A. This is largely done for impedance reasons and to prevent digital signal transitions from negatively impacting the performance of an analog device. The alternating stack location of analog and digital grounds in FIG. 4A is used as an example and many perturbations are possible.

However, with improved filter and Power Distribution management the need to have separate analog and digital grounds is not needed.

Figure 4B:
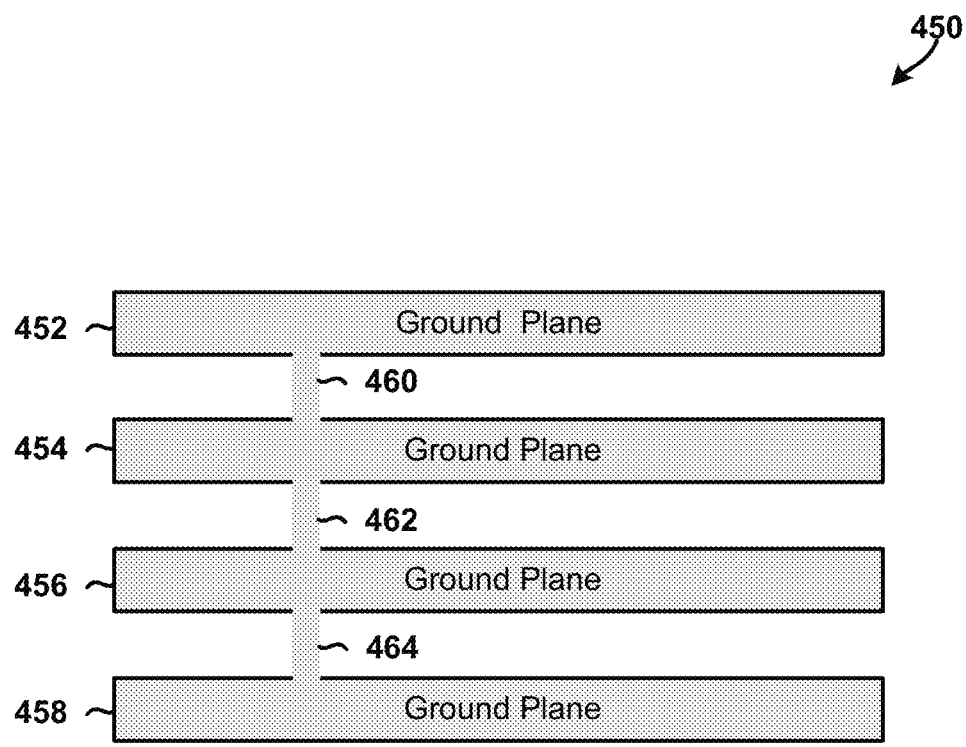

FIG. 4B illustrate a shared grounding system 450 in accordance with some embodiments. The shared grounding system 450 includes ground planes 452-458 that are coupled together via one or more leads 460-464. This is, the first, second, third and fourth ground plane layers (i.e., layers 452-458) provide a shared common ground for analog and digital signals. This configuration (i.e., of the shared grounding system 450) improves noise and power distribution, reduces decoupling caps with equivalent for better impendence matching, and separates grounds from signal traces to improve circuit/PCB density.

In FIG. 4B all the grounds in the multi-layer PCB are shared and act as one large ground. Utilizing a common ground plane for both digital and analog signals further reduces the stack size needed leading to increased miniaturization. The sharing of a common ground plane for digital and analog signals also allows for a significant savings in manufacturing cost due to the need for less metal.

The common ground plane enables a common voltage reference for all the devices in the multi-layer PCB. However, by sharing a common connection conducted noise may be increased because when current flows in any conductor a magnetic field is generated.

If current flows in ground plane a differential voltage may be set up resulting in the reference being unequal in the PCB.

Capacitor Parasitic Inductance is typically a value is often considered to be the most important characteristic. In power system applications, the parasitic inductance (ESL) has the same or greater importance. Capacitor package dimensions (body size) determine the amount of parasitic inductance. Physically small capacitors usually have lower parasitic inductance than physically large capacitors. Surface-mount chip capacitors are the smallest capacitors available and are a good choice for discrete decoupling capacitors.

Filter capacitors are used in a multi-layer PCB to reduce unwanted noise. However, capacitors are frequency dependent as well as adding impedance. The capacitors effectiveness is reduced based the overall impendence of the capacitor and impedance introduced through the overall loop area the capacitor interacts with. The higher the frequency of noise the easier it is for the parasitic impedance to isolate the filter caps.

Figure 5:
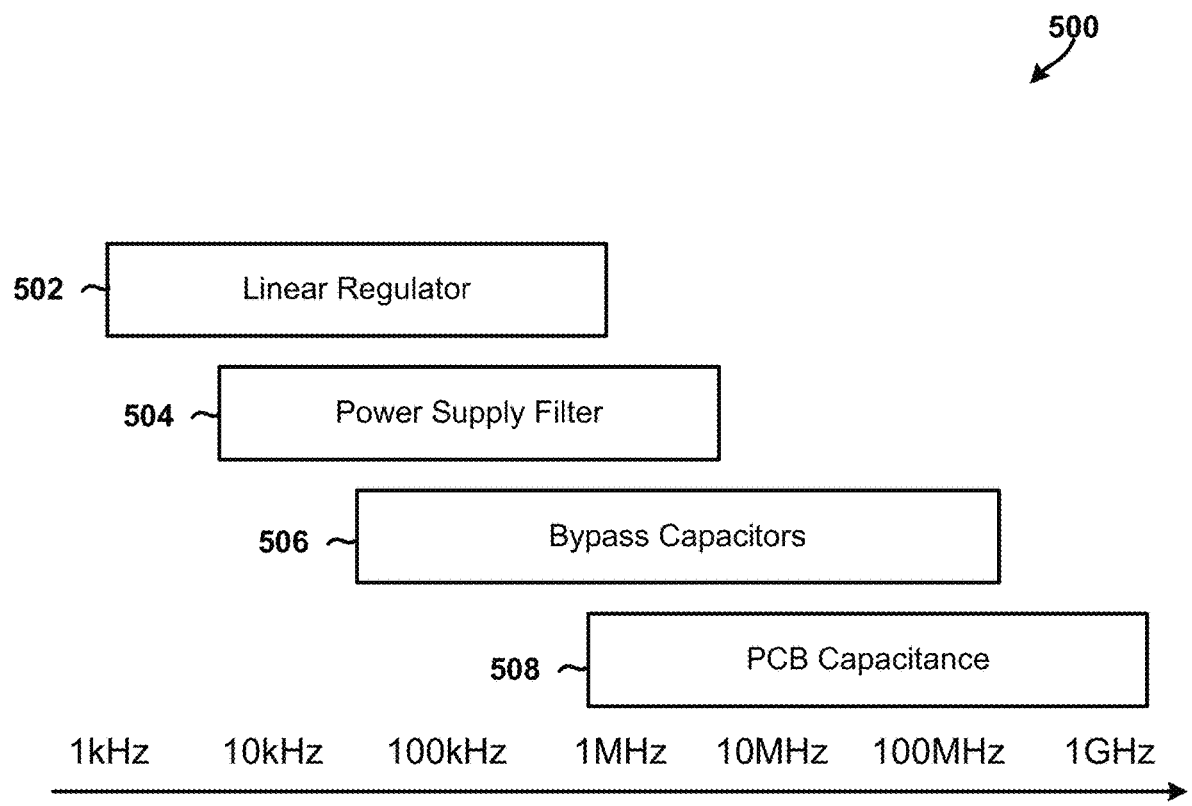
FIG. 5 is a component block diagram that illustrates the relationship between capacitance filtering and frequency in a multi-layer printed circuit board configured in accordance with some embodiments.

FIG. 5 illustrates frequency responses for noise reduction on a multi-layer PCB 500. In particular, FIG. 5 illustrates the relationship between bypass capacitors used on a multi-layer PCB 500 and the PCB capacitance itself.

In the example illustrated in FIG. 5, the multi-layer PCB 500 includes a linear regulator 502, a power supply filter 504, bypass capacitors 506, and a PCB capacitance 508 unit.

Capacitance (508) in a multi-layer PCB is directly related to the cross section of the stack layer, the dielectric properties of the prepreg (PP) and core, and the distance between the individual and collective stack layers.

However, another method of reducing the overall impedance is to reduce the amount of filter or bypass capacitors utilized on the multi-layer PCB.

Every capacitor has a narrow frequency band where it is most effective as a decoupling capacitor. This band is centered at the capacitor's self-resonant frequency $F_{RSELF}$. The effective frequency bands of some capacitors are wider than others. A capacitor's ESR determines the capacitor's quality (Q) factor, and the Q factor may determine the width of the effective frequency band.

It is important to distinguish between the capacitor's self-resonant frequency and the mounted capacitor's effective resonant frequency when the capacitor is part of the system.

Mounted parasitic inductance is a combination of the capacitor's own parasitic inductance and the inductance of the PCB lands, connecting traces, vias, and power planes.

Decoupling capacitors are quite frequently implemented to reduce the impedance of a power distribution network and provide the required charge to the switching circuits, lowering the power supply noise.

A decoupling capacitor is most effective at the narrow-frequency band around its resonant frequency, and thus, the resonant frequency must be reviewed when choosing a capacitor collection to build up a decoupling network.

The decoupling capacity has two primary goals: (1) charge supply; and (2) filtering.

Charge supply: They allow local charge supply and are considered as charge reservoirs. The purpose is for circuits operating at higher switching speeds enabling them to have quick access to the charge reservoir to draw the required current. Decoupling capacitors are an effective way to provide the required charge to a switching current load within a short period of time. The decoupling capacitors are also used to keep the power rail transient voltages within design limits for the circuit.

Filtering: The noise due to the switching of the transistors is be shunted to ground by use of the decoupling capacitor. The decoupling capacitors reduce the voltage supply, Vdd, core noise. The decoupling capacitor also help suppress the cavity noise generated by high bandwidth signals.

Figure 6A:
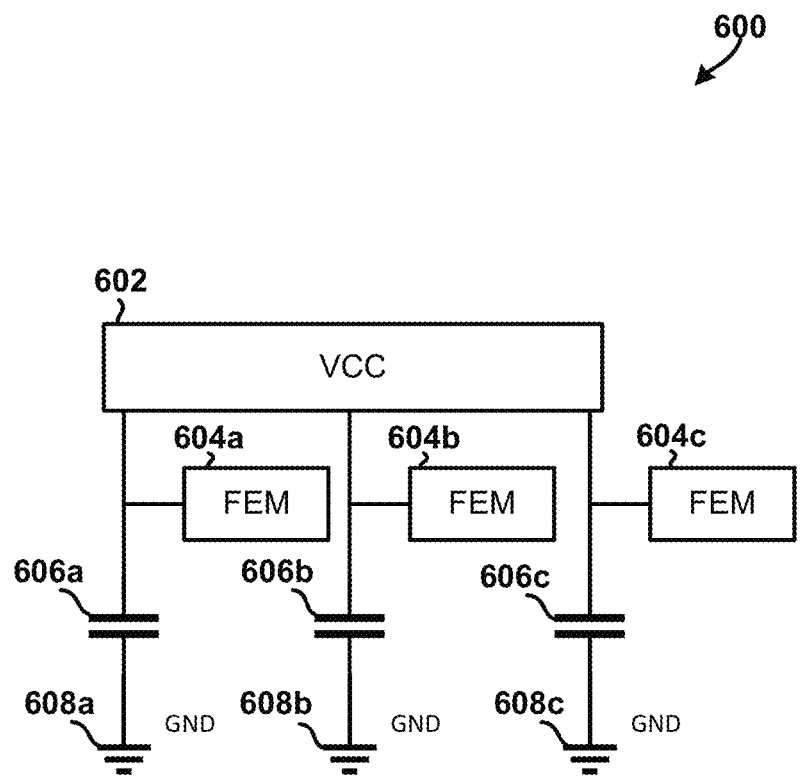
FIGS. 6A and 6B are component block diagrams that illustrate decoupling capacitors that could be included in a multi-layer printed circuit board configured in accordance with some embodiments.
Figure 6B:
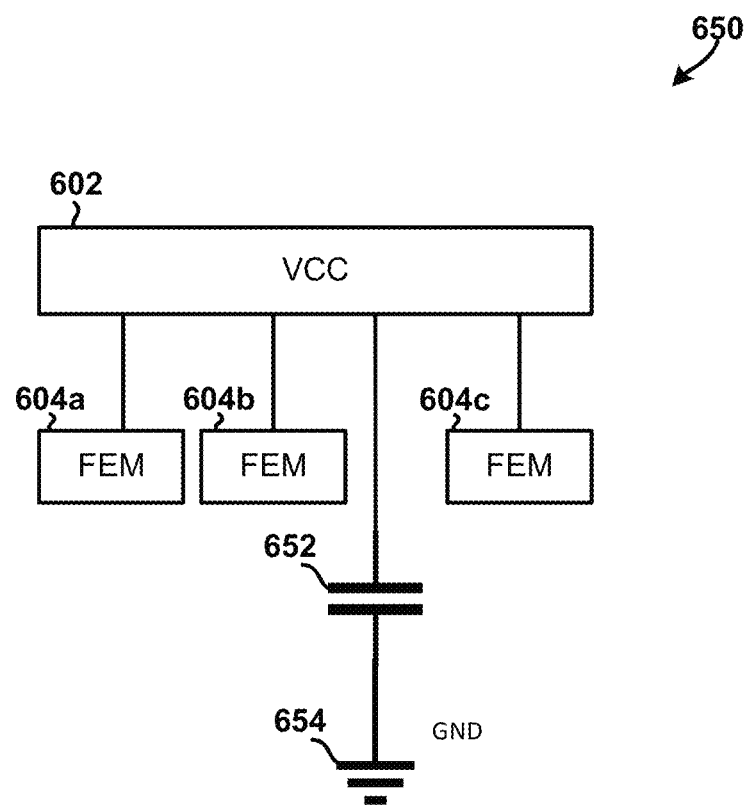

FIG. 6A illustrates a circuit 600 that includes a voltage common collector 602 component, a plurality of finite element method (FEM) components 604a-c, a plurality of decoupling capacitors 606a-c, and a plurality of ground 608a-c components. FIG. 6B illustrates a circuit 650 that includes shared decoupling capacitors 562 coupled to ground 654.

Industry design practice for decoupling, bypass, capacitors involve having one bypass capacitor per discrete device as shown in FIG. 6A. However, the number of bypass capacitors may be reduced in a multi-layer PCB. The number of bypass capacitors may be reduced by grouping bypass capacitors together and treating them as parallel capacitor thereby using a larger value bypass capacitor in place of multiple bypass capacitors as shown in FIG. 6B.

The combining of multiple bypass capacitors results in reducing the amount of board real estate needed for all the bypass capacitors and reduces the overall component cost since less discrete components are needed. The reduction in discrete components also reduces manufacturing costs as allows for a standard bypass capacitor to be utilized.

The reduction in the number of decoupling capacitors allows for one capacitor size to be used predominantly. The reduction in the variety of decoupling capacitor sizes also helps reduce the overall cost and eases manufacturing.

The reduction in the decoupling capacity values used for the multi-layer PCB also insures a steady state of power for the circuit. The reduction in the decoupling capacitor values used also leads to a larger overall decoupling capacitor being used. The larger decoupling capacitor has a better voltage verse temperature ratio allowing the circuit to perform better in thermally challenged environments which also include enclosures that are fanless.

The decoupling capacitor is also complemented by the multilayer stack overall capacitance. The PCB layers using a prepreg (PP) with metal also add an additional capacitance for filtering. By adjusting the thickness of the prepreg along with the dialectic of the prepreg the stack layer may be viewed as a capacitor used for additional filtering for high frequency noise.

Current spreads out as it flows from one point to another in both the power and ground planes, very similar to skin effect. The inductance in these planes is spreading inductance where the shape of the plane and not its size determined the amount of inductance.

Spreading inductance resists the capacitors ability to respond to transient current and needs to be minimized.

For high-frequency power distribution systems, power and ground planes work in pairs, with their inductances coexisting dependently with each other. The spacing between the power and ground planes determines the pair's spreading inductance. The closer the spacing (the thinner the dielectric), the lower the spreading inductance.

As the plane area increases and as the separation between power and ground planes decreases, the value of this capacitance increases.

In a multi-layer PCB having the ground layers introduced that cover the entire stack layer along with the prepreg (PP) small footprint along with the dielectric used increases the overall capacitance used for improved filtering.

Power and ground should be run directly over each other, which reduces impedance and minimizes loop area.

Signal Return Grounds: a loop is made by a signal, and the ground return path from the receiver device back to the signal source. Signal return paths present the most difficult design problem in PCB layout Reducing the loop area by routing the return for the signal underneath the signal trace is most effective way of dealing with this problem. Therefore, creating a ground grid is the most important thing to do after floor planning in laying out the PCB.

However distributed capacitance of the power routing may become the source for noise at higher frequencies. To counter this ferrite beads are used to suppress the unwanted signal. Thus, the ferrite bead blocks the sourcing of RF current from the power line connection.

Ferrite beads are meant to be placed for every power input to the circuit in a multi-layer PCB. A ferrite core in series with the power feed is an effective low-pass filter for the input power rails. A ferrite beads has a very high impedance at high frequencies and almost negligible impedance at low frequencies.

However, at high frequencies the extensive use of ferrite beads while providing filtering also alters the impedance load on the power source.

Figure 7A:
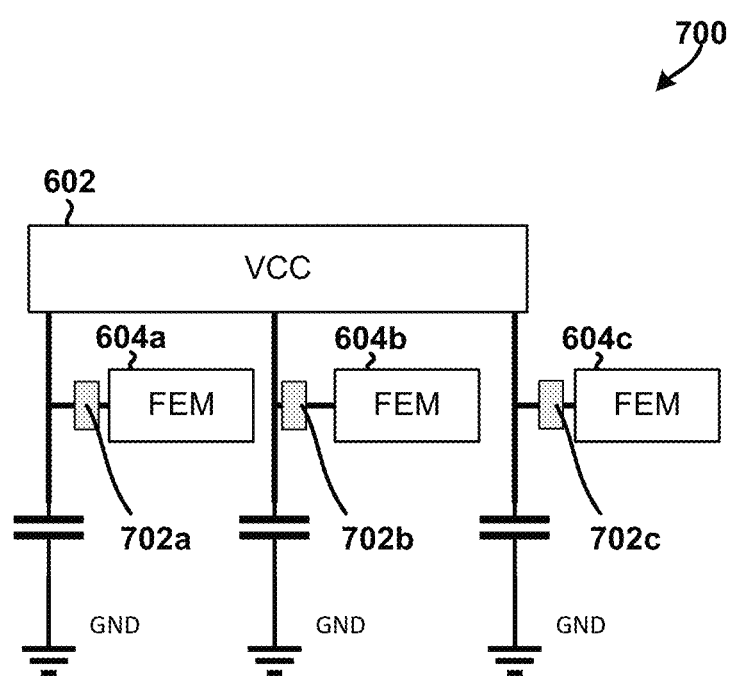
FIGS. 7A and 7B are component block diagrams that illustrate ferrite beads that could be included in a multi-layer printed circuit board configured in accordance with some embodiments.
Figure 7B:
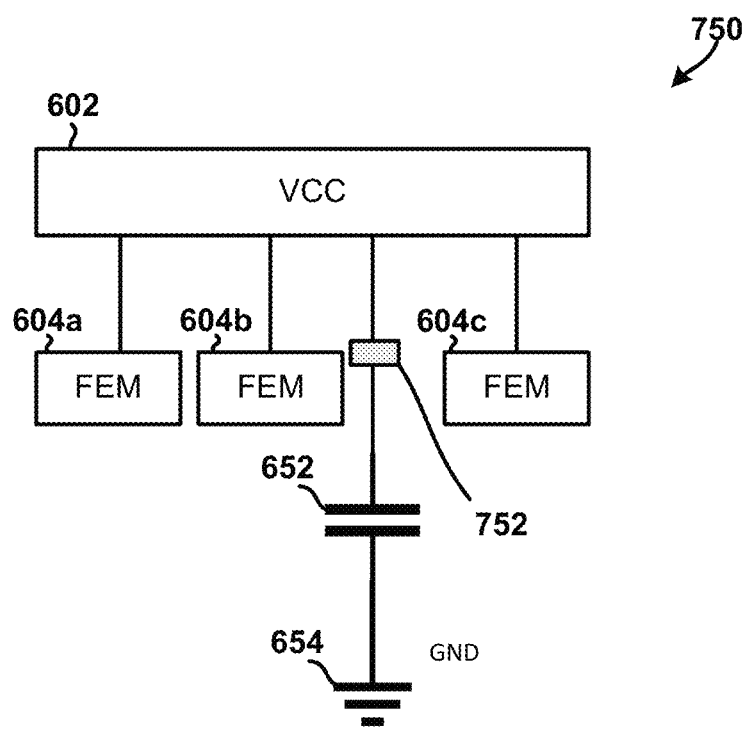

FIG. 7A illustrates a circuit 700 that includes one ferrite bead 702a-c per FEM 604a-c. FIG. 7B illustrates a circuit 750 that includes one ferrite bead 752 for N FEM components 604a-c (i.e., 1-to-N ferrite bead to FEM ratio).

Standard practice is to use a ferrite bead per FEM as shown in FIG. 7A. However, with the use of a decoupling cap scheme shown in FIG. 6B it is possible to reduce the amount of ferrite beads used. In FIG. 7B the number of ferrite beads is reduced so there is one ferrite bead per N FEMs.

Through selective use of the ferrite beads instead of using the design practice of a ferrite bead per power input improves the impedance match with the power supply. The benefit of the impedance match with the power supply results in a better power transfer from the power rail to the circuit allowing the circuit to operate from a lower rail voltage and overall reduced power consumption. The reduced power consumption also reduces the thermal loading on the circuit enabling the circuit to be used in thermally challenged environments including those requiring a fanless enclosure.

With and PCB and especially with a multi-layer PCB the correct design of the power Supply filter helps eliminate many problems and improves power supply efficiency.

The power distribution system (PDS) or power distribution network (PDN) is made up of a regulator and multiple stages of bypass, decoupling capacitors, that accommodates the device current demand and responds to current transients as quickly as necessary to maintain the voltage within the specified limits.

When these current demands are not met, the voltage across the device's power supply changes. This is observed as noise. Inductance in the current path of the capacitors should be minimized, because it retards the ability of decoupling capacitors to quickly respond to changing current demands.

The use of 1:N ferrite beads per FEM improves the overall PDN impedance match with the voltage regulator. The improved impedance match helps deliver the maximum amount of power for a changing load.

Having the power and ground planes next to each other on a single stack layer creates what is called planner capacitance effecting the overall frequency response as well as stack layer impedance. The specific geometry of the ground and power planes on the stack layer contributes largely to the overall planer capacitance.

The planer capacitance may be used to help improve the noise and filtering by making their relationship specific to higher frequency filtering and thereby contribute to the overall noise reduction scheme implemented in the multi-layer PCB.

Impedance is a function of resistance, capacitance, and inductance and varies over frequency. The impedance seen by the power supply and the circuit should be maintained in a system such that the power supply noise doesn't exceed a maximum value. The power supply noise shouldn't exceed the target impedance.

Power delivery network (PDN) design is critical for providing clean power to integrated circuits, such as field-programmable gate arrays (FPGAs) and other electronic devices. A PDN consists of a voltage regulator and decoupling capacitor.

The voltage regulator job is to provide power to the circuit. As the power draw load changes the voltage regulator adjusts the amount of current it is supplying to keep the output voltage constant.

The decoupling capacitor works in conjunction with the voltage regulator. The decoupling capacitor functions as the device's local energy storage for delivering additional power when needed.

Figure 8A:
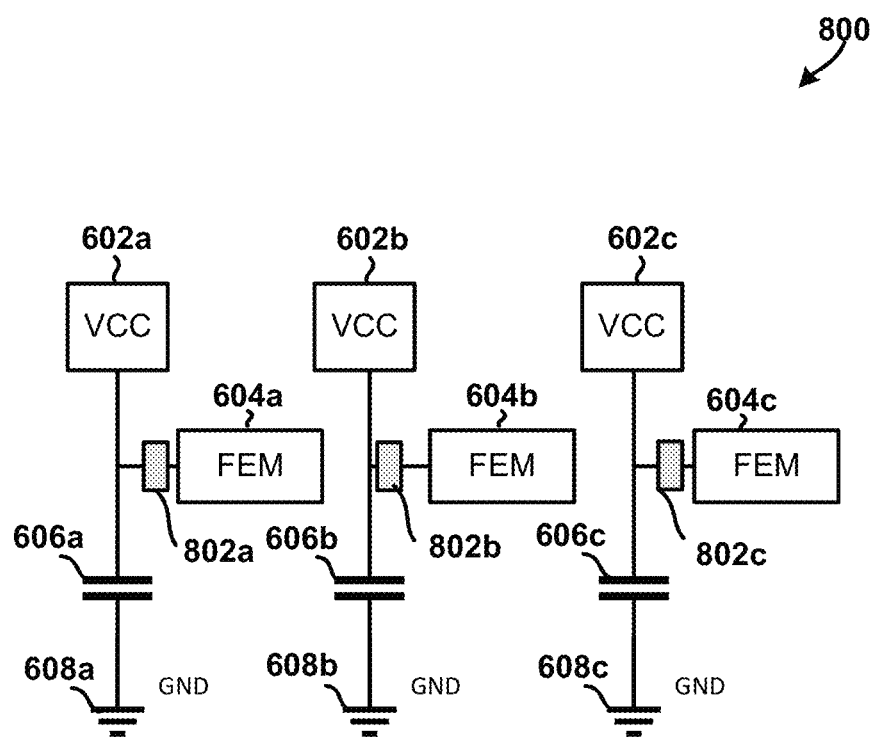
FIGS. 8A and 8B are component block diagrams that illustrate power delivery network (PDN) for multi-layer printed circuit board configured in accordance with some embodiments.
Figure 8B:
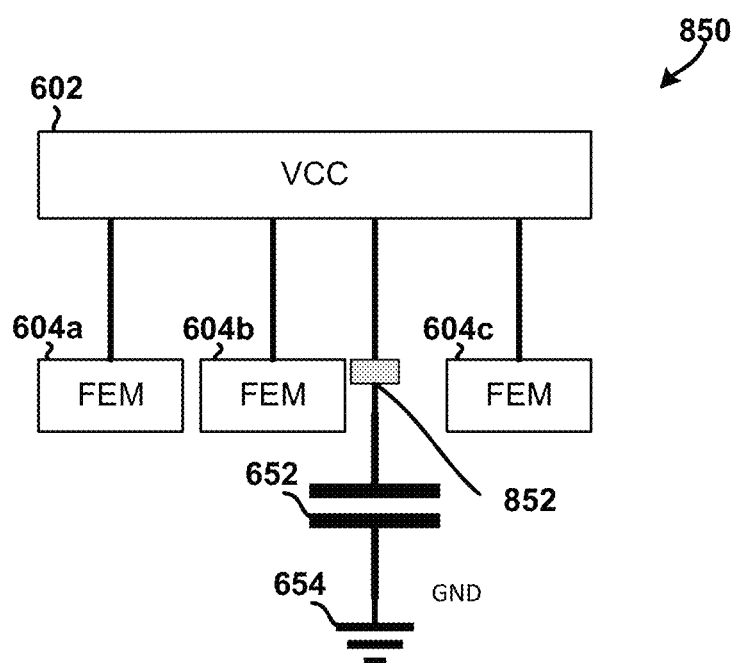

FIG. 8A illustrates a multi-layer printed circuit 800 board that includes multiple VCC components 602a-c and a single PDN 802a-c for each of the plurality of FEM components 604a-c. FIG. 8B illustrates a multi-layer printed circuit board 850 that includes a common PDN 852 for multiple FEM components 604a-c.

A multi-layer PCB has several PDNs that are used for delivering power to all the circuits. Typically, there is a PDN for each module that is used on the multiplayer PCB. The use of multiple PDNs is a common and well understood design practice as shown in FIG. 8A. The separate power patch is used to isolate each power supply for each subcomponent and sensitive electronics.

However, a single PDN may be used for many functional element modules, circuits as shown in FIG. 8B. The single PDN reduces the amount of PDN patches, grids or sections that are associated with a multi-layer PCB. The single PDN for many functional elements is possible due to the improved filtering and decoupling capacitance scheme utilized. The single PDN also reduces the complexity of the power distribution scheme avoiding the need to grid parts of each stack layer used for delivering the power to the circuit. The common PDN also reduces the overall cost of the circuit by reducing the amount of voltage regulators needed to provide the power source for each component.

The foregoing method descriptions and the process flow diagrams are provided merely as illustrative examples and are not intended to require or imply that the blocks of the various embodiments must be performed in the order presented. As will be appreciated by one of skill in the art the order of blocks in the foregoing embodiments may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the embodiments disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A multi-layer printed circuit board (PCB), comprising:
a plurality of layers comprising:
   a plurality of signal layers,
   a plurality of ground plane layers,
   a plurality of inner signal layers, and
   a single core substrate layer,
wherein:
   each individual layer in the plurality of layers is separated from its immediately adjacent layers by one or more prepreg substrate layers,
   each of the one or more prepreg substrate layers is less rigid than the single core substrate layer,
   the one or more prepreg substrate layers bond two or more of the prepreg separated individual layers together, and
   the prepreg-separated individual layers include the plurality of signal layers, the plurality of ground plane layers, and the plurality of inner signal layers.

2. The multi-layer PCB of claim 1, wherein the one or more prepreg substrate layers provide the overall structural integrity of the multi-layer PCB.

3. The multi-layer PCB of claim 1, wherein first, second, third and fourth ground plane layers of the plurality of ground plane layers are connected via one or more leads to provide a shared common ground for both analog and digital signals.

4. The multi-layer PCB of claim 1, wherein the multi-layer PCB further comprises a single decoupling capacitor per N finite element method (FEM) components.

5. The multi-layer PCB of claim 1, wherein the multi-layer PCB includes one ferrite bead per N finite element method (FEM) components.

6. The multi-layer PCB of claim 1, wherein the multi-layer PCB includes a single power distribution network (PDN).

* * * * *